United States Patent [19]
Kiuchi

[11] Patent Number: 5,501,517
[45] Date of Patent: Mar. 26, 1996

[54] CURRENT DETECTING DEVICE WITH TEMPERATURE COMPENSATING DEVICE

[75] Inventor: Shin Kiuchi, Matusmoto, Japan

[73] Assignee: Fuji Electric Co., Ltd., Kawasaki, Japan

[21] Appl. No.: 166,995

[22] Filed: Dec. 16, 1993

[30] Foreign Application Priority Data

Dec. 17, 1992 [JP] Japan ................................. 4-336464

[51] Int. Cl.$^6$ ..................................................... H02H 3/08
[52] U.S. Cl. ............................ 361/101; 361/93; 361/100
[58] Field of Search ............................. 361/103, 93, 100, 361/101, 18

[56] References Cited

U.S. PATENT DOCUMENTS 4,297,741 10/1981 Howell ........................................ 361/93

Primary Examiner—Brian K. Young
Assistant Examiner—Sally C. Medley
Attorney, Agent, or Firm—Kanesaka & Takeuchi

[57] ABSTRACT

A current detecting device of the invention has a temperature compensating function used for a current limiting device. A sensing resistance and a reference voltage source are connected to a comparison device. A compensating device, such as semiconductor element, is inserted in series into the reference voltage source in a voltage source circuit for supplying a reference voltage to compensate a temperature dependency of the sensing resistance. Temperature dependency of the reference voltage is a negative temperature dependency in the forward voltage drop. The manufacturing process of the current detecting device becomes simple.

8 Claims, 5 Drawing Sheets

CURRENT DETECTING DEVICE WITH TEMPERATURE COMPENSATING DEVICE

BACKGROUND OF THE INVENTION AND RELATED ART STATEMENT

The present invention relates to a current detecting device by which an overcurrent can be detected with an operational amplifier of differential amplification type, wherein the device has a temperature compensating function for the current detection value or current limit value.

FIG. 7 shows a circuit diagram for a current limiting device together with a switching element to be protected, by which a switching element is protected from being destroyed by detecting an overcurrent flowing through the switching element. A current limiting device 30 controls a current flowing from a power supply 1 to a load 2, and is equipped with an output stage MOSFET 7 to control a main current 4 by a driving circuit 5, a sensing MOSFET 6 by which a shunted current 3 shunted from the main current 4 is controlled, and a current detecting device 25 by which the value of the shunted current 3 flowing to the sensing MOSFET 6 is detected.

The current detecting device 25 has a sensing resistance 11 which generates a voltage drop corresponding to the value of the shunted current 3, a voltage source circuit 10 which generates a reference voltage to compare with the detected voltage drop at the sensing resistance 11, and a comparator by which the reference voltage and the detected voltage are compared. In this device, an operational amplifier 9 of differential amplification type is used as the comparator.

Further, the output of this operational amplifier 9 is supplied to a logic circuit 8. The logic circuit 8 judges if a value of the shunted current 3, i.e. a value of the main current 4, is in a state of an overcurrent based on an output value of the operational amplifier 9. In case of an overcurrent, the logic circuit 8 outputs a signal for the drive circuit 5, so that the main current 4 flowing in the output stage MOSFET 7 is limited.

In such current limiting device 30 or current detection device 25, one of problems is the fluctuations of resistance value of the sensing resistance 11 according to temperature change. For instance, when resistance of the sensing resistance 11 has a positive temperature dependency, an overcurrent state may not be judged even if the main current is in an overcurrent condition at a low temperature. On the other hand, at a high temperature it is judged that an overcurrent state occurs even if the main current 4 is less than the range of the overcurrent.

Then, in the conventional device 30 or device 25, a current-mirror circuit as shown in FIG. 8 is installed in the operational amplifier 9, and input resistances 17 of the current-mirror circuit are adjusted to become an appropriate temperature dependency. Here, the input resistances 17 are inserted between a power supply 21 and each of a (+) side input terminal 18 and a (−) side input terminal 19. Numeral 20 is a constant current supply source.

The input resistances 17 are formed of well-known semiconductor resistances. Since a temperature dependency rate of a resistance value of a semiconductor changes according to the composition of the semiconductor, the semiconductors made of an appropriate composition are chosen, so that the temperature dependency of an offset voltage of the operational amplifier 9 is determined.

For instance, a temperature dependency rate KR (a ratio of the change of a semiconductor resistance value relative to the change of temperature Tj) in a semiconductor resistance composed of the P+ layer of the polysilicon becomes about ½ of the temperature dependence rate KR of a semiconductor resistance composed of the P+layer of silicon (Si), as shown in FIG. 9. Therefore, the temperature dependency of an offset voltage of the operational amplifier 9 can be adjusted by using semiconductor resistances for the input resistances 17 to thereby compensate the temperature dependency of the sensing resistance 11. Therefore, the overcurrent detecting device with high accuracy and the current limiting device can be made.

However, in order to form an overcurrent detecting device with high accuracy or a current limiting device where the temperature dependency is compensated by using such sensing resistances 11, it is required to install the semiconductor resistances having different temperature characteristics respectively, i.e. semiconductor resistances of different compositions. Since different manufacturing processes are necessary to form the different semiconductor resistances, in the conventional method, the process requires many steps and is complex when comparing to the case of manufacturing a device without the compensating function. Thus, the manufacturing term and cost increase.

In view of the above problems, in the present invention, the compensating function to the temperature dependency of a sensing resistance is formed without using semiconductor resistance of different temperature characteristics, and it is an object of the invention to provide a current detecting device which can be manufactured in a short term and low cost.

SUMMARY OF THE INVENTION

In order to solve the above problems, in the present invention, voltage control means for compensating a temperature dependency is equipped on a reference voltage side of comparison means for comparing with a detection voltage. That is, a current detecting device of the invention is formed of voltage source means for generating a reference voltage in which temperature compensation is made, current detection means for generating a detection voltage corresponding to a flowing current, and comparison means for comparing the reference voltage and the detection voltage.

The voltage source means includes a reference voltage source which generates a substantially constant voltage, and the voltage control means connected in series to the reference voltage source. The voltage control means is compensation means, in which value of a voltage drop changes based on the temperature. A diode, bipolar transistor, MOSFET, and so on can be used as such compensation means.

Further, the present invention includes a current limiting device formed of such a current detecting device and load current limiting means for limiting a load current based on the results of judgement of the comparison means.

As above mentioned, a compensating function to the temperature dependency is not required at a side of the comparison means by installing the compensation means for adjusting the temperature dependency rate at the side of the voltage source means where the reference voltage is generated. Thus, while the current detecting device has the compensating function to the temperature dependency of the sensing resistance, it is possible to use the semiconductor resistances for the operational amplifiers and so on, which are similar in manufacturing process to those of the comparison means. Therefore, the chips to be used in these devices can be manufactured with a simplified process in a short term and becomes low cost.

As the current detection means, a sensing resistance is generally used, and this sensing resistance has a positive temperature dependency in many cases. Then, a diode, bipolar transistor, MOSFET, and so on where a value of a voltage drop has a negative temperature dependency is connected in series to the reference voltage source, so that the reference voltage compared to the detection voltage becomes positive temperature dependency. Therefore, the positive temperature dependency of the detection voltage obtained by the sensing resistance can be compensated.

DETAILED DESCRIPTION OF THE PREFERRED EMBODIMENTS

Embodiments of the present invention will be explained in detail as follows with reference to the accompanying drawings.

Figure 1:
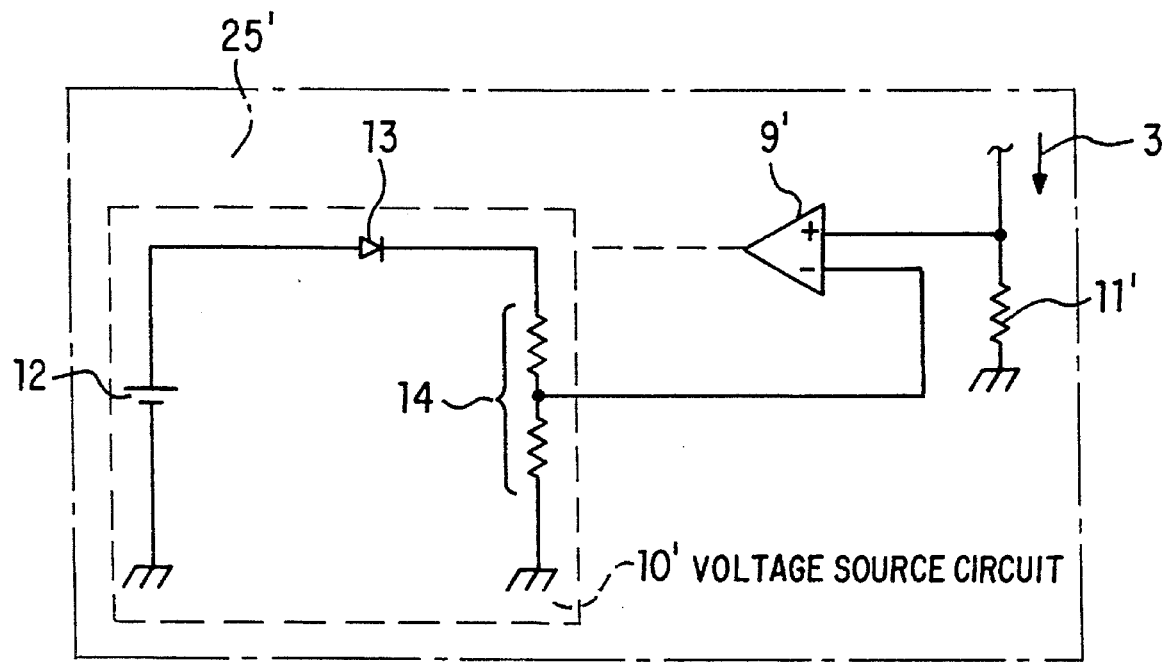
FIG. 1 shows a voltage source circuit in a current detecting device of the present invention.
Figure 10:
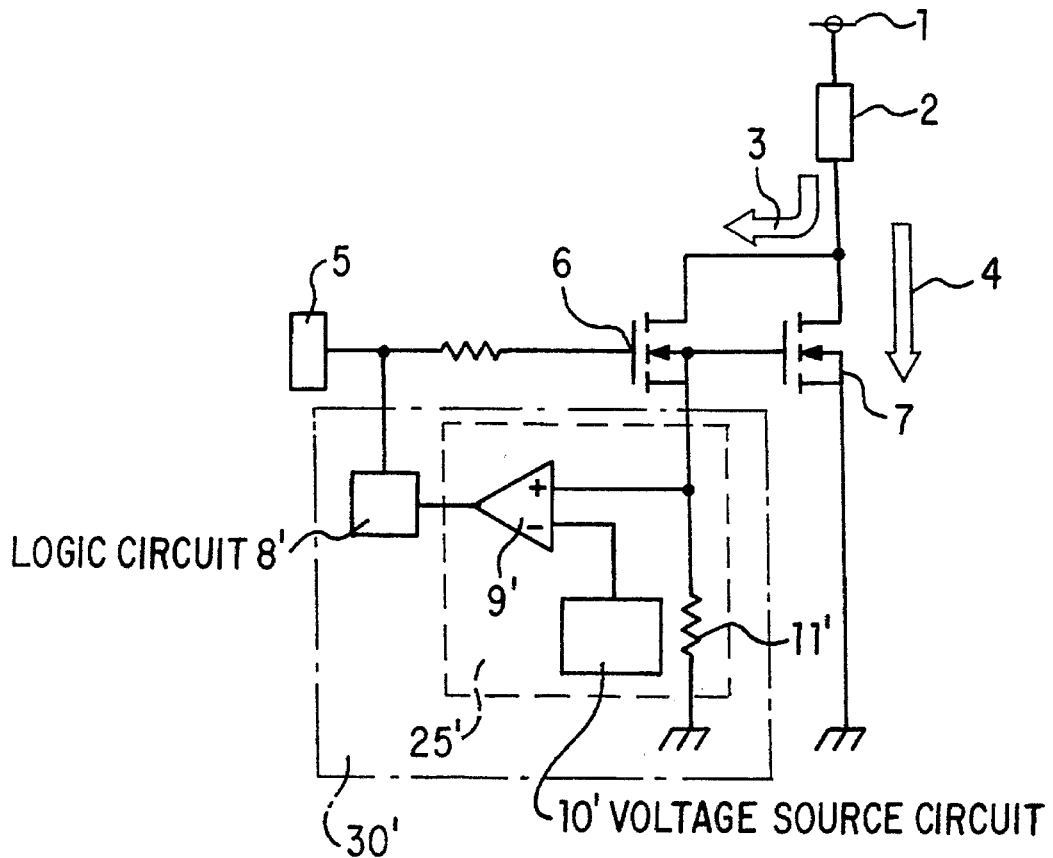
FIG. 10 is a circuit diagram where an overcurrent limiting device is shown together with peripheral devices.

FIG. 1 shows a main structure of a voltage source circuit 10' in a current detecting device 25' of one embodiment of the present invention. The current detecting device 25' of the embodiment is a device which is used for a current limiting device 30' (FIG. 10) and so on for limiting an overcurrent passing through a switching element, and detects the current value of a shunted current 3 proportional to the current which flows from a power source 1 to load 2.

Also, the current detecting device 25' includes a sensing resistance 11' for providing voltage drop or detection voltage corresponding to the value of the shunted current 3, and an operational amplifier 9' which compares the detection voltage generated at the sensing resistance 11' and a reference voltage supplied from the voltage source circuit 10'. Moreover, in case an output of the operational amplifier 9' is led to the logic circuit 8' for judging if a main current is in a overcurrent condition, it is possible to form a current limiting device 30' which limits current flowing in an output stage MOSFET.

As a principle point in the current detecting device 25' of the embodiment, a diode 13 where voltage drop has negative temperature dependency is inserted into the voltage source circuit 10' from which the reference voltage is supplied to the operational amplifier 9'. That is, the voltage source circuit 10' of the embodiment has a reference voltage source 12, a voltage dividing resistance 14 and the diode 13 inserted serially between the voltage source 12 and the resistance 14. Here, the voltage dividing resistance 14 bears the role that the voltage supplied from the reference voltage source 12 is set at the desired reference voltage which should be compared with the detection voltage in the operational amplifier 9'.

Figure 2:
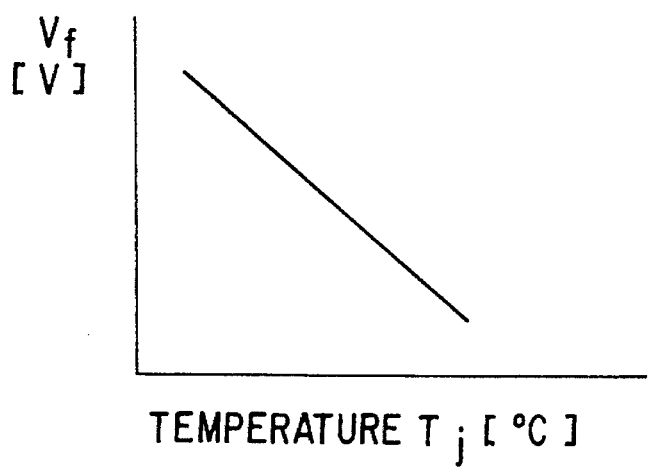
FIG. 2 is a graph showing a temperature dependency of a forward voltage drop Vf of a diode used for a voltage source circuit shown in FIG. 1.
Figure 3:
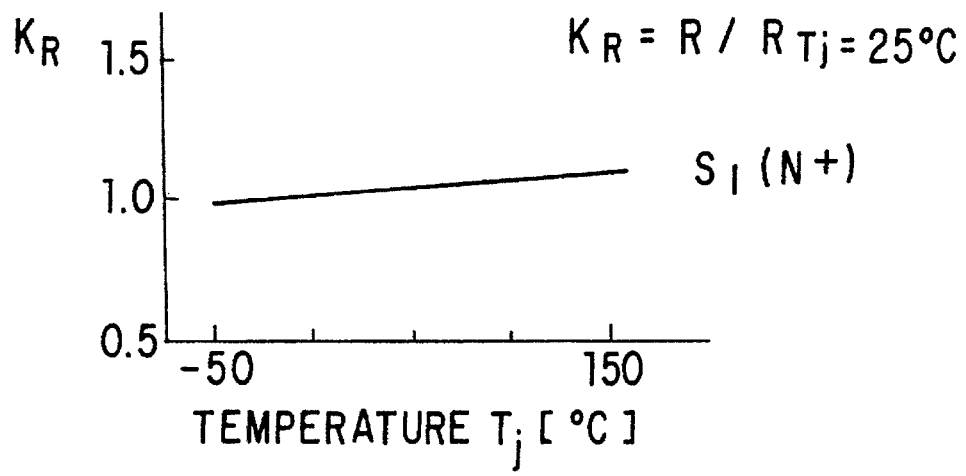
FIG. 3 is a graph showing a temperature dependency of a resistance value of a sensing resistance of the current detecting device shown in FIG. 1.

In a PN junction of the diode 13, forward voltage drop Vf has a negative temperature dependency to the junction temperature Tj as shown in FIG. 2. On the other hand, a resistance value of the sensing resistance 11' formed of $N^+$ layer of silicon (Si) has the positive temperature dependency rate $K_R$ to the temperature Tj as shown in FIG. 3. Therefore, when considering the temperature dependency of a sensing resistance only, the resistance value of the sensing resistance 11' increases when the temperature rises, so that the value of the voltage drop at the sensing resistance 11' has the tendency of increase.

Figure 4:
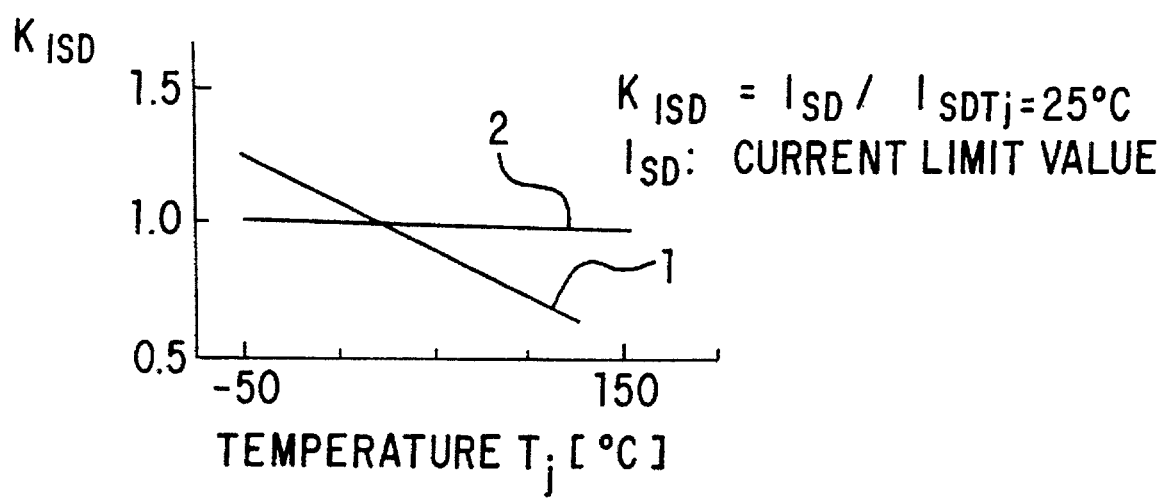
FIG. 4 is a graph showing an overcurrent limiting value with a temperature compensating function (1) and an overcurrent limiting value without a temperature compensating function (2) with respect to temperature Tj.

When the shunted current with the value set as an overcurrent flows through the sensing resistance 11' at high temperature, a higher voltage drop value, i.e. a higher detection voltage value, is input to the operational amplifier 9'. When the value of the reference voltage input to the operational amplifier 9' is constant regardless the temperature, the current limiting operation occurs, since the current detecting device operates and judges as an overcurrent even if the current does not actually reach the overcurrent. Reversely, when temperature decreases, it can not be judged to reach the overcurrent by the value of the detection voltage even if the current reaches the overcurrent, so that a current limiting operation does not occur. This status is shown in graph (1) of FIG. 4.

However, in the voltage source circuit 10' of the embodiment, the diode 13 having a negative temperature dependency in the forward voltage drop Vf is inserted. Therefore, if the temperature rises, the forward voltage drop Vf decreases and the value of the reference voltage supplied from the voltage dividing resistance 14 to the operational amplifier 9' increases. Thus, increase of the detection voltage according to the temperature dependency of the sensing resistance 11' is compensated by the increase of the reference voltage, so that the operational amplifier 9' can judge the overcurrent with a constant overcurrent value regardless the temperature.

Similarly, when the temperature decreases, the reference voltage decreases owing to the rise of the forward voltage drop Vf. Therefore, the decrease of the detection resistance value because of the temperature dependency of the sensing resistance 11' is compensated by the decrease of the reference voltage, and the value of the overcurrent judged by the operational amplifier 9' is kept constant. This state is shown in graph (2) in FIG. 4.

In the reference voltage source circuit from which the reference voltage is supplied to the operational amplifier 9' for the comparison in the current detection device 25' of the embodiment, the diode 13 is inserted in series into the reference voltage source 12 as mentioning above, so that the positive temperature dependency of the sensing resistance 11' is compensated, and it is possible to judge the overcurrent based on a constant current value without any relation to the change of the temperature. Therefore, the temperature effect, which is a conventional problem, can be excluded and a current limiting device with high accuracy can be offered in a circuit or device which achieves an important function, such as the protection of a switching element, from the overcurrent.

Further, the important point of the current detection device 25' of the embodiment is not to provide temperature compensating function to the comparison part, such as operational amplifiers, which requires a complex manufacturing process, different from conventional circuits or devices. That is, the compensating function for the temperature is achieved by using a diode in a voltage source circuit with a simple structure, and it is not necessary to use a semiconductor resistance with different temperature dependency in a comparatively complex circuit, such as operational amplifiers.

Therefore, the manufacturing process of a semiconductor chip used for the current detecting device of the embodiment can omit complex manufacturing processes for semiconductor resistances of different types. Thus, a manufacturing process becomes simple and circuits or devices can be offered in a short term and low cost.

Figure 5:
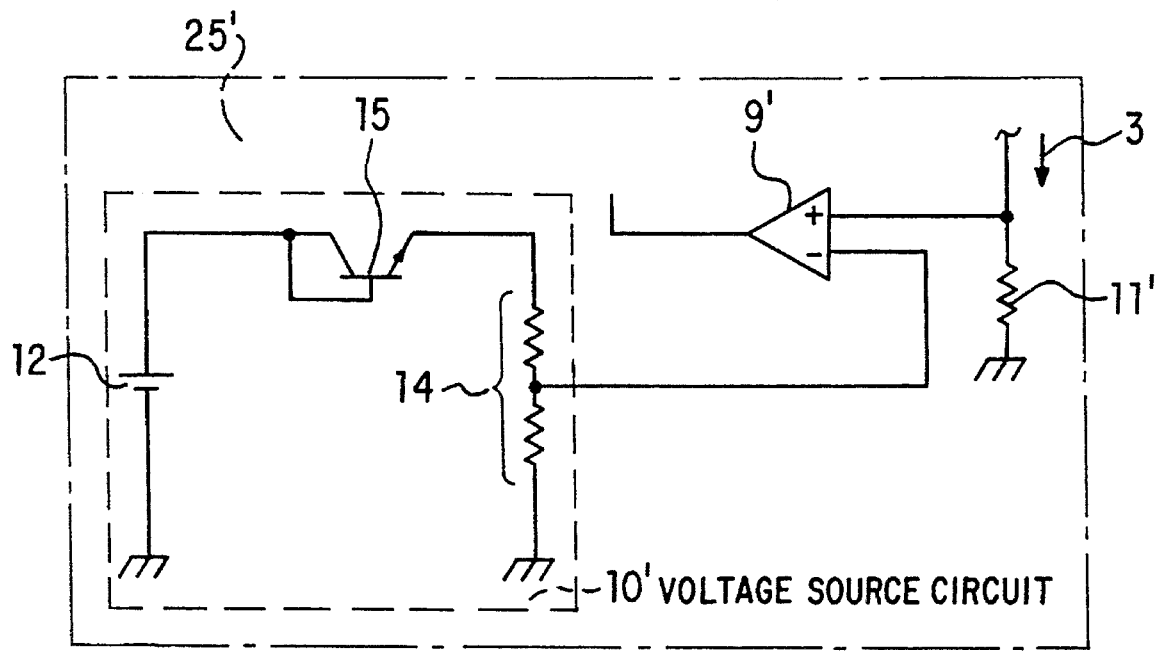
FIG. 5 shows a voltage source circuit in a current detecting device of a different embodiment of the present invention.
Figure 6:
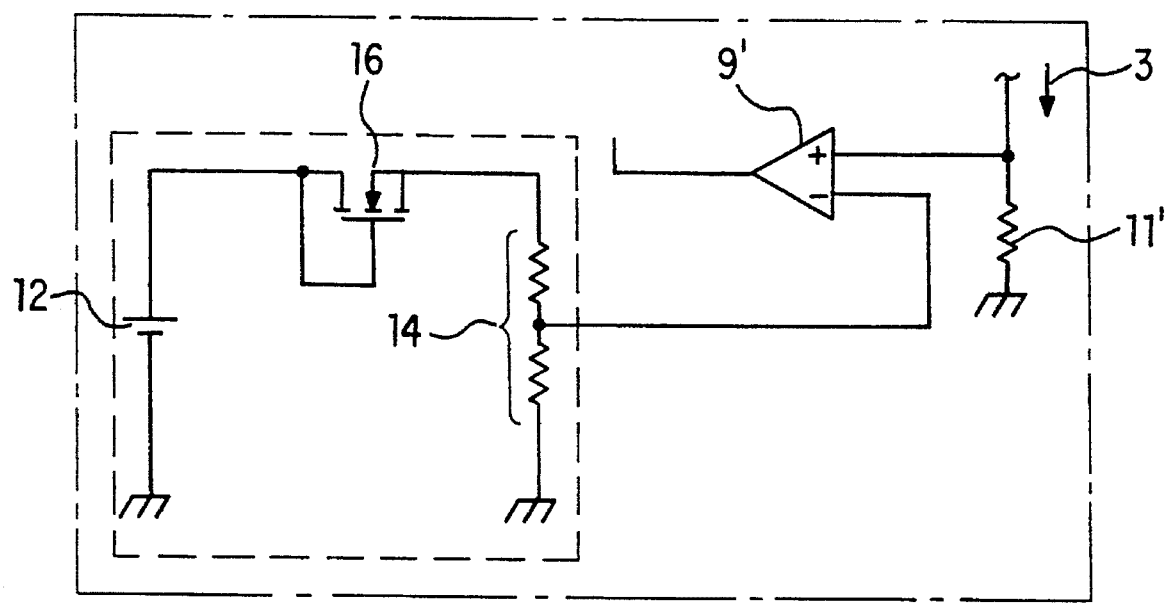
FIG. 6 shows a voltage source circuit in a current detecting device of a further different embodiment of the present invention.

Besides, the quantity of the diode built in the reference voltage source 10' is not limited to the above structure, and of course, it is possible to insert two or more diodes to compensate the temperature dependency of the sensing resistance. Moreover, it is possible to provide the compensating function of the reference voltage by using the temperature dependency of the PN junction of a bipolar transistor 15 as shown in FIG. 5. Further, it is possible to provide the compensating function of the reference voltage by using the temperature dependency of the PN junction of a MOSFET 16 as shown in FIG. 6.

Figure 7:
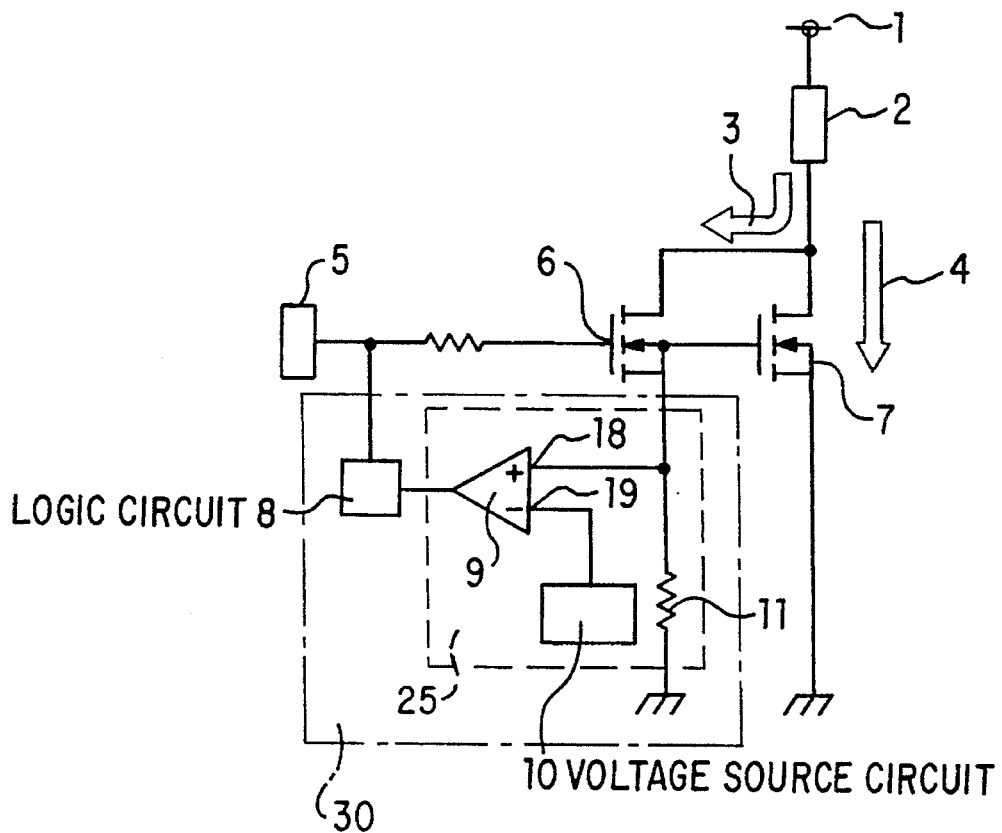
FIG. 7 is a circuit diagram where a general overcurrent limiting device is shown together with peripheral devices.
Figure 8:
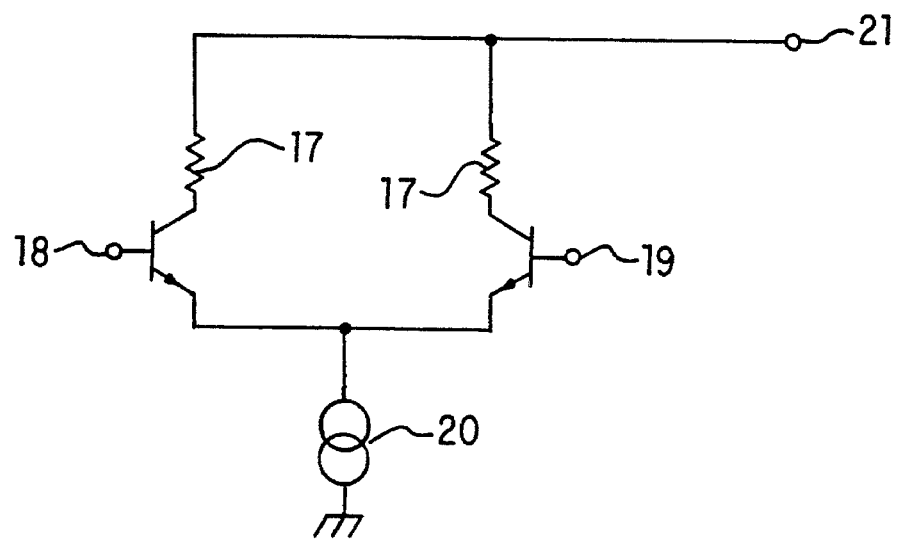
FIG. 8 is a circuit diagram where an operational amplifier conventionally used as comparison means of a current detecting device is shown.
Figure 9:
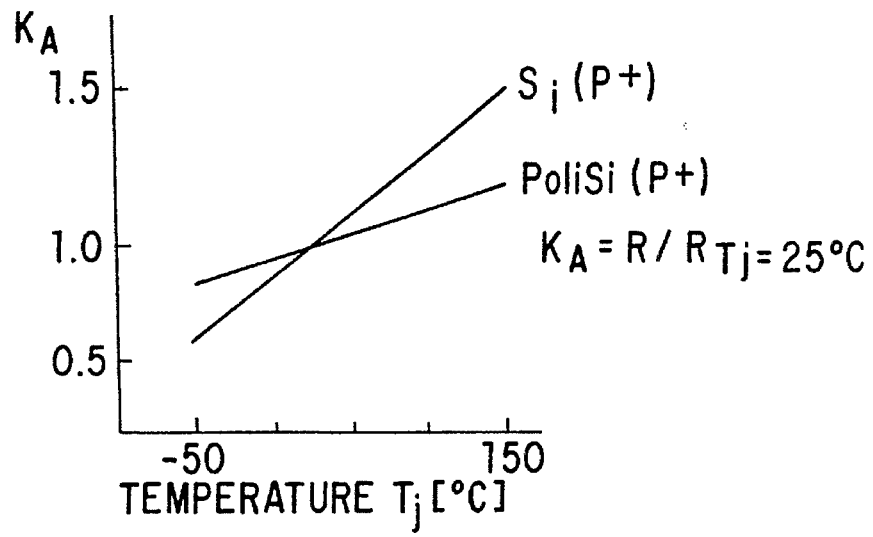
FIG. 9 is a graph where a temperature dependency of a semiconductor resistance used to provide a temperature compensating function to the operational amplifier in FIG. 8 is shown.

In addition, the shunted current flows in the sensing resistance by using a sensing MOSFET 6 besides an output stage MOSFET 7 in FIG. 7, but alternatively, of course, it is possible to equip a sensing resistance for the current detection simply on the grounding side of the source of the output stage MOSFET 7. Moreover, it is, of course, possible to use semiconductor elements, such as bipolar transistors or IGBTs taking the place of the output stage MOSFET 7.

The present invention does not depend on the method of using a semiconductor resistance with different temperature characteristic for the comparison means such as conventional operational amplifiers as explained above, but achieves a current detecting device which is possible to provide a simple structure with the temperature compensating function to the voltage source circuit side for supplying a reference voltage and to be manufactured in a short term and low cost. Therefore, although the current detecting device of the present invention is a device with the temperature compensation function and high accuracy which can be adopted to an important protective device such as overcurrent limiting devices, it is possible to manufacture a current detecting device and current limiting device in a short term and at low price.

Moreover, semiconductor elements which can be introduced by conventional processes, such as diode, bipolar transistor, MOSFET, etc. can be adopted as a compensation means prepared on the voltage source circuit side by using the temperature characteristic in the forward voltage drop of PN junction. Therefore, the current detecting device and current limiting device of the present invention are suitable current detecting device and current limiting device for so-called power semiconductor elements such as MOSFET, IGBT of large capacity.

While the invention has been explained with reference to the specific embodiments of the invention, the explanation is illustrative and the invention is limited only by the appended claims.

What is claimed is:

1. A device for detecting a current flowing through a circuit, comprising:

current detecting means connected to the circuit and providing a detection voltage corresponding to the current flowing through the circuit;

comparison means connected to the current detecting means for receiving the detection voltage; and voltage source means connected to the comparison means for providing to the comparison means a reference voltage changeable corresponding to temperature so that the comparison means compares the reference voltage with the detection voltage, said voltage source means including a reference voltage source for generating a constant voltage, voltage control means and voltage dividing means with a dividing point, which are connected together in series, output voltage of said voltage source means being extracted at the dividing point in the voltage dividing means, temperature dependency rate of the voltage control means being inversely proportional to temperature dependency rate of said current detecting means to thereby prevent change of a predetermined overcurrent value due to temperature change.

2. A current detecting device as claimed in claim 1, wherein said voltage control means is a diode.

3. A current detecting device as claimed in claim 1, wherein said voltage control means is a bipolar transistor.

4. A current detecting device as claimed in claim 1, wherein said voltage control means is a MOSFET.

5. A current detecting device as claimed in claim 1, wherein said voltage control means has a characteristic such that forward voltage drop has negative temperature dependency.

6. A current detecting device as claimed in claim 5, wherein said current detecting means has a characteristic such that forward voltage drop has positive temperature dependency.

7. A device for detecting a current flowing through a circuit, comprising:

a sensing resistance connected to the circuit and providing a detection voltage corresponding to the current flowing through the circuit, said detection voltage having first temperature dependency rate;

comparison means connected to the sensing resistance for receiving the detection voltage; and voltage source means connected to the comparison means for providing to the comparison means a reference voltage changeable corresponding to the first temperature dependency rate so that the comparison means compares the reference voltage with the detection voltage and judges a predetermined overcurrent without relating to temperature of the sensing resistance, said voltage source means including a reference voltage source for generating a constant voltage and voltage control means connected in series to said reference voltage source, said voltage control means having second temperature dependency rate inversely proportional to the first temperature dependency rate so that when the detection voltage at the sensing resistance changes due to change of temperature, the reference voltage supplied from the reference voltage source is changed to correspond thereto to thereby prevent change ofa value of the predetermined overcurrent due to temperature change.

8. A current detecting device as claimed in claim 7, wherein said voltage source means further includes voltage dividing means having a dividing point and connected in series to the voltage control means, output voltage of said voltage source means being extracted at the dividing point in the voltage dividing means and supplied to the comparison means.

* * * * *